United States Patent [19]
Morich et al.

[11] Patent Number: 5,545,996
[45] Date of Patent: Aug. 13, 1996

[54] GRADIENT COIL WITH CANCELLED NET THRUST FORCE

[75] Inventors: Michael A. Morich, Mentor; Labros S. Petropoulos, Solon, both of Ohio

[73] Assignee: Picker International, Inc., Highland Heights, Ohio

[21] Appl. No.: 303,620

[22] Filed: Sep. 9, 1994

Related U.S. Application Data

[63] Continuation-in-part of Ser. No. 286,887, Aug. 5, 1994, Pat. No. 5,485,087, and a continuation-in-part of Ser. No. 269,393, Jun. 30, 1994, and a continuation-in-part of Ser. No. 213,099, Mar. 15, 1994, Pat. No. 5,497,089.

[51] Int. Cl.$^6$ .................... G01V 3/00; G01V 3/14
[52] U.S. Cl. ............................ 324/318; 324/322
[58] Field of Search .................... 324/318, 322

[56] References Cited

U.S. PATENT DOCUMENTS

| | | | |
|---|---|---|---|
| 4,617,516 | 10/1986 | Schenck | 324/318 |
| 4,646,024 | 2/1987 | Schenck et al. | 324/318 |
| 4,737,716 | 4/1988 | Roemer | 324/319 |
| 5,177,442 | 1/1993 | Roemer | 324/318 |
| 5,185,576 | 2/1993 | Vavrek et al. | 324/318 |
| 5,198,769 | 3/1993 | Frese et al. | 324/318 |
| 5,278,504 | 1/1994 | Patrick et al. | 324/318 |
| 5,349,297 | 9/1994 | DeMeester et al. | 324/318 |
| 5,372,137 | 12/1994 | Wong et al. | 324/318 X |

FOREIGN PATENT DOCUMENTS

| | | |
|---|---|---|
| 231879 | 1/1987 | European Pat. Off. . |
| 2262808A | 1/1996 | United Kingdom . |
| WO93/04493 | 3/1993 | WIPO . |
| WO94/28430 | 12/1994 | WIPO . |

OTHER PUBLICATIONS

"Torque Free Asymmetric Gradient Coils for Echo Planar Imaging", Abduljalil, et al., Mag. Res. in Medicine, vol. 31, No. 4, Apr. 1994 Baltimore, MD, pp. 450–453.

"Torque Compensated Asymmetric Gradient Coils for EPI", Abduljalil, et al., SMRM 12th Annual Meeting, vol. 3, p. 1306 (1993).

"Minimum inductance coils", Turner, J. Phys. E:Sci. Instrum. 21 (1988) pp. 948–952.

"High–Order, Multi–Dimensional Design of Distributed Surface Gradient Coil", Oh, et al., SMRM 12th Annual Meeting, p. 1310 (1993).

"NMR Imaging in Biomedicine, Supplement 2," Mansfield, et al., pp. 268–269 (1982).

"Compact Magnet and Gradient System for Breast Imaging", Pissanetzky, et al., SMRM 12th Annual Meeting, p. 1304 (1993).

*Primary Examiner*—Sandra L. O'Shea
*Assistant Examiner*—Mack Haynes
*Attorney, Agent, or Firm*—Fay, Sharpe, Beall, Fagan, Minnich & McKee

[57] ABSTRACT

Superconducting magnets (10) generate a temporally constant magnetic field through a bore (12). The bore, hence the superconducting magnets, have a length which is relatively short compared to its diameter, a length to diameter ratio of less than 1.0 to 1.5 and preferably 1:1. A gradient coil assembly (30) is disposed around the bore for generating gradient magnetic fields across the bore. With such a relatively short bore magnet, in the region in which the gradient field coil is disposed, the main magnetic field suffers non-uniformities including radial magnetic field components. When current pulses are fed through the windings of a primary gradient coil (32) and a secondary gradient coil (34), the currents interact in an unbalanced manner with the non-uniformities and radial components of the temporally constant magnetic field, causing a net force in axial and/or transverse directions. Additional windings (62, 72) are mounted adjacent the ends of the gradient coil, carrying current in an opposite direction to z and transverse gradient windings in order to produce a counterbalancing force such that the net and counterbalancing forces substantially cancel. In this manner, the gradient coil assembly is freed from the necessity of a substantial mechanical mountings and the vibration and distortion which large net forces can cause.

12 Claims, 3 Drawing Sheets

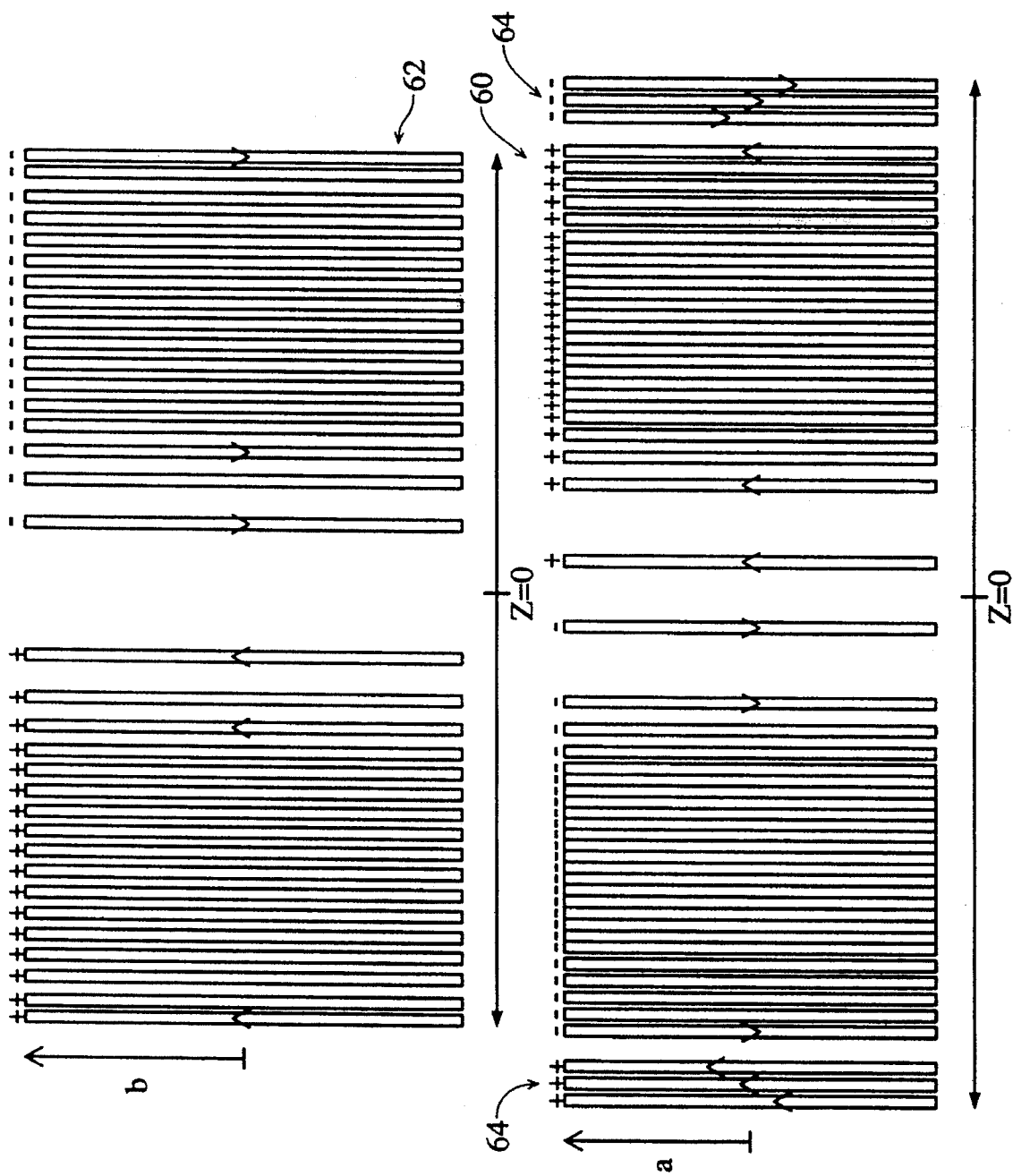

GRADIENT COIL WITH CANCELLED NET THRUST FORCE

This application is a continuation-in-part of U.S. applications Ser. Nos. 08/286,887 filed Aug. 5, 1994, now U.S. Pat. No. 5,485,087, 08/269,393, filed Jun. 30, 1994, and 08/213,099, filed Mar. 15, 1994, U.S. Pat. No. 5,497,089.

BACKGROUND OF THE INVENTION

The present invention relates to the magnetic resonance imaging arts. It finds particular application in conjunction with gradient coils for "short" bore magnets and will be described with particular reference thereto. It is to be appreciated, however, that the present invention will also find application in conjunction with coils for other magnets, particularly magnets in which a gradient coil is disposed in a magnetic field such that Lorentzian force components are not balanced.

Magnetic resonance imagers commonly include a bore having a diameter of 90 centimeters or more for receiving the body of an examined patient. The bore is surrounded by a series of annular superconducting magnets for creating a substantially uniform magnetic field longitudinally along the patient receiving bore. The more axially spaced the annular magnets, the more uniform the primary magnetic field within the patient receiving bore tends to be and the longer the axial dimension over which such magnetic field uniformity exists. Typically, the bore is at least 1.6 meters long and often longer.

One of the drawbacks to such "long" bore magnets is that the region of interest is often inaccessible to medical personnel. If a procedure is to be performed based on the image, the patient must be removed from the bore before the procedure can be performed. Moving the patient risks potential misregistration problems between the image and the patient.

One way to improve access to the patient is to shorten the length of the magnet and the patient receiving bore. If the magnet and the bore were shortened to about 1 meter or roughly the diameter of the bore, patient access is much improved. Although the size of the uniform magnetic field area compresses to a more disk-like shape, the area of substantial uniformity is still sufficient for a series of 10 to 20 contiguous slice images. NMR helical or continuous scanning methods can also be employed.

Although an adequate imaging volume remains, the magnetic field in the volume around the periphery of the bore which receives the gradient coil tends to become relatively non-uniform and has both axial z-components and radial x,y-components. The gradient coil generally includes windings for generating three linear and orthogonal magnetic field gradients for providing spatial resolution and discrimination of nuclear magnetic resonance signals. Gradient coils are typically designed and constructed to optimize strength and linearity over the imaging volume and stored energy and inductance in the gradient coil. See, for example, U.S. Pat. No. 5,296,810 of Morich. To create the magnetic field gradients, current pulses are applied to the x, y, and/or z-gradient coils. These currents interact with the main magnetic field to generate Lorentz forces on the gradient coil. Due to the symmetries included in gradient coil currents, the Lorentz forces across the entire coil cancel when the gradient coil is disposed in a uniform magnetic field. However, when the main magnetic field is less uniform, particularly when there are significant radial and non-uniform axial components in the neighborhood of the gradient coils, a net thrust can be developed. Typically, pulsing the z-gradient coil causes a net thrust in the z-direction, pulsing the x-gradient coil develops a net thrust in the x-direction, and pulsing the y-gradient coil causes a net thrust in the y-direction. In the case of the z-gradient coil, the net axial force can be on the order of a few hundred pounds. These net thrusts tend to push or urge the gradient coil axially out of the bore. Although the gradient coil can be anchored mechanically, these large forces still tend to cause acoustic noise and increased vibrations to the magnet and the patient. Such vibration has deleterious effects on imaging, such as a loss of resolution.

The present invention contemplates a new and improved gradient coil which overcomes the above-referenced problems and others.

SUMMARY OF THE INVENTION

In accordance with the present invention, a magnetic resonance imaging apparatus is provided. A gradient magnetic field coil is disposed around a patient receiving bore which is surrounded by a main magnetic field magnet. The main magnetic field magnet generates a magnetic field which is less than ideally uniform and has radial components in the region of the gradient field coil. The gradient field coil is designed to optimize strength, linearity over the imaging volume, and stored energy and inductance, as well as to minimize forces due to interaction of the current pulses applied to the gradient coil and the main magnetic field.

In accordance with a more limited aspect of the present invention, additional windings are provided at least at one end of the gradient coil winding. The additional windings receive current pulses which interact with the main magnetic field in such a manner that any net force or thrust attributable to the current being pulsed through the other windings is substantially cancelled.

In accordance with a more limited aspect of the present invention, the gradient coil is a self-shielded gradient coil. The primary gradient magnetic field coil is wound adding coils as necessary in order to zero the net force on the primary and shield gradient coils.

In accordance with another aspect of the present invention, the gradient coil includes a z-gradient coil which is a plurality of loops extending circumferentially around the bore. On one side of isocenter, most of the windings carry current in a first direction and on the other side of isocenter, most of the windings carry current in a second direction opposite to the first direction. Windings are included on the first end of the coil having current flowing in the second direction, and windings are added on at the end of the second end having current flowing in the first direction. The amounts of opposite direction current flowing in these windings are selected such that there is substantially zero net axial thrust in the z-direction on the z-gradient coil windings.

In accordance with another aspect of the present invention, a new and improved method of calculating gradient current windings is provided. An additional constraint is added such that the net thrust forces on all windings is zero.

One advantage of the present invention is that it facilitates access to portions of the patient in the examination region.

Another advantage of the present invention is that it improves image quality.

Another advantage of the present invention is that it simplifies mounting and construction of gradient coils.

Other advantages of the present invention include reduced vibrations and facilitating the construction of magnetic resonance imaging systems with short bores or main magnets.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

FIGS. 2A and 2B illustrate exemplary current distributions for z-primary and shield gradient coils; and, FIGS. 3A and 3B illustrate a primary and shield or secondary x or y-gradient coil winding in accordance with the present invention.

DETAILED DESCRIPTION OF THE PREFERRED EMBODIMENTS

Figure 1:
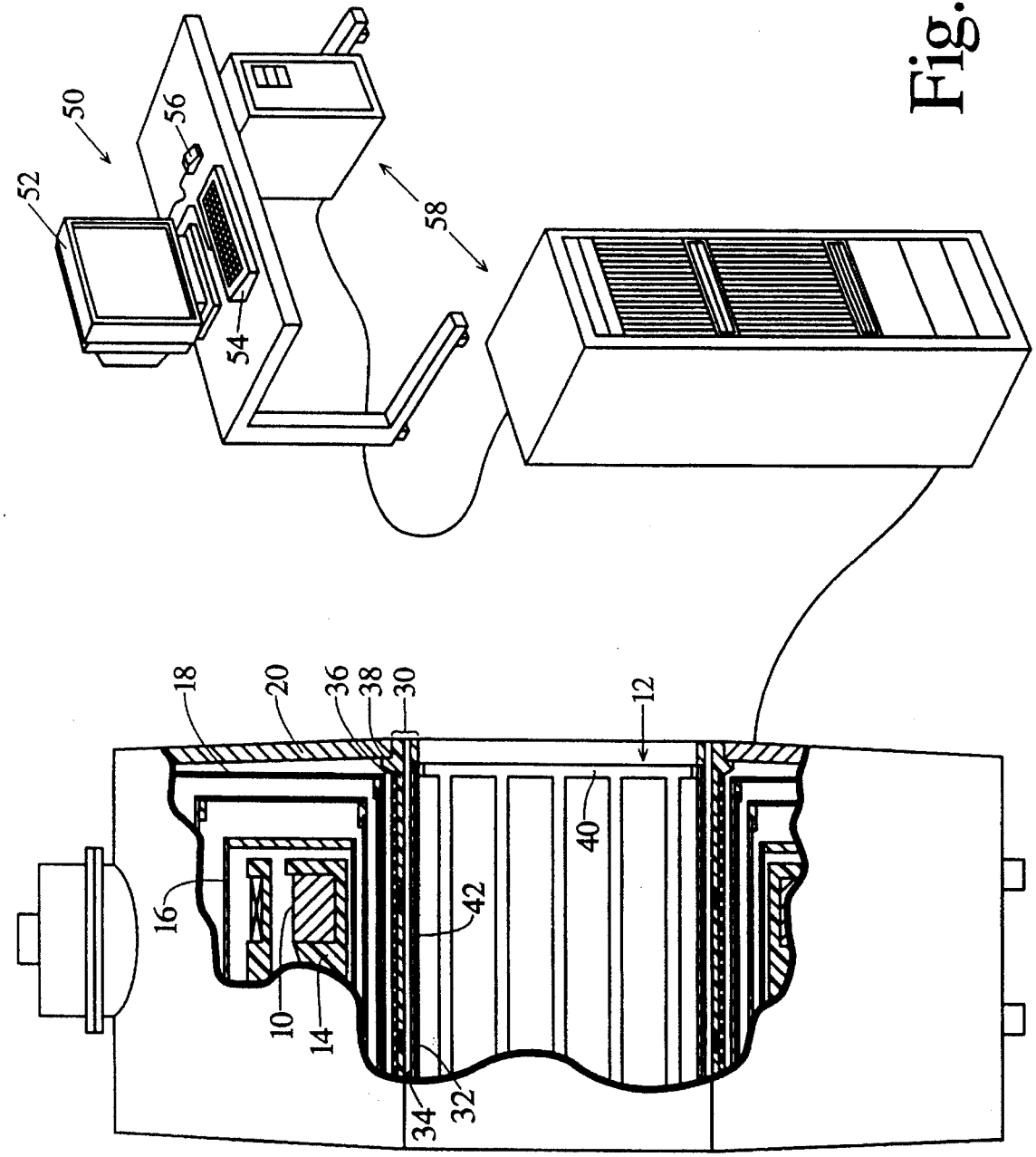
FIG. 1 is a diagrammatic illustration of a magnetic resonance imaging system including a gradient coil in accordance with the present invention.

With reference to FIG. 1, a plurality of primary magnet coils 10 generate a temporally constant magnetic field along a longitudinal or z-axis of a central bore 12. In a preferred superconducting embodiment, the primary magnet coils are supported by a former 14 and received in a toroidal helium vessel or can 16. The vessel is filled with liquid helium to maintain the primary magnet coils at superconducting temperatures. The can is surrounded by one or more cold shields 18 which are supported in a vacuum dewar 20.

A whole body gradient coil assembly 30 includes x, y, and z-coils mounted around the bore 12. Preferably, the gradient coil assembly is a self-shielded gradient coil assembly that includes primary x, y, and z-coil assemblies 32 potted in a dielectric former 34 and a secondary or shield gradient coil assembly 36 that is supported on a bore defining cylinder 38 of the vacuum dewar 20. The dielectric former 34 with potted gradient coils can function as a bore liner or a cosmetic bore liner can be inserted to line it. Preferably, shims (not shown) for adjusting the magnetic field are positioned as needed between the primary and shield coil dielectric formers as taught by DeMeester, et al. in U.S. Pat. No. 5,349,297. A whole body RF coil 40 is mounted inside the gradient coil assembly 30. A whole body RF shield 42, e.g. a layer of copper mesh, is mounted between RF coil 40 and the gradient coil assembly 30.

An operator interface and control station 50 includes a human-readable display such as a video monitor 52 and an operator input means including a keyboard 54 and a mouse 56. Track balls, light pens, and other operator input devices are also contemplated. Computer racks 58 hold a magnetic resonance sequence memory and controller, a reconstruction processor, and other computer hardware and software for controlling the radio frequency coil 38 and the gradient coil 30 to implement any of a multiplicity of conventional magnetic resonance imaging sequences, including echo-planar, echo-volume, spin echo, and other imaging sequences. Echo-planar and echo-volume imaging sequences are characterized by short data acquisition times and high gradient strengths and slew rates. The racks 58 also hold a digital transmitter for providing RF excitation and resonance manipulation signals to the RF coil and a digital receiver for receiving and demodulating magnetic resonance signals. An array processor and associated software reconstruct the received magnetic resonance signals into an image representation which is stored in computer memory, on disk, or in other recording media. A video processor selectively extracts portions of the stored reconstructed image representation and formats the data for display by the video monitor 52. An image printer can also be provided for making paper copies of selected images.

In the preferred embodiment, the diameter and length of the bore 12 have a size ratio of about 1:1. However, it is to be appreciated that the present invention is also applicable to other magnets, particularly magnets with limited main magnetic field uniformity. Typically, one might expect magnets with a bore length to diameter ratio of up to 1.5:1 to be candidates for the present invention. However, the present invention will also be applicable to magnetic resonance imagers with longer bores in which there is a sufficient main magnetic field non-uniformity, particularly radial field components, in the area of the gradient coils to cause image degradation due to vibration or in which there are sufficient net forces that mechanical mounting of the gradient coils becomes difficult.

The main magnetic field magnets 10 produce a main magnetic field $B_0$ over the imaging volume. In the short bore magnets, the z-component of the main magnetic field $B_{z0}$ remains constant over a central imaging region of about 40 to 45 centimeters in diameter in a x,y plane at the magnetic isocenter. Along the z-axis, the imaging region is shorter than 40 centimeters. Outside the ellipsoidal, uniform, imaging region, the B field changes significantly at larger axial or z-displacements from isocenter and with radial or $\rho$ displacement from the central axis of the bore. The dependence of $B_{z0}$ on the axial and radial positions becomes more significant around the gradient and RF coil locations, typically the region bounded by 30 cm.$\leq \rho \leq$40 cm. and $-60$ cm.$\leq z \leq$60 cm and encompassing all angular positions. Although inside the imaging region, the contribution of the radial component of the main magnetic field $B_{\rho 0}$ to the total value of the $B_0$ field is negligible, it is much more significant at the gradient coil sets' location, particularly in short bore magnet designs.

The interaction between the spatially varying components of the magnetic fields and the current densities of the coil set creates two distinct problems. First, there is an interaction between the azimuthally directed current of the z-gradient coil with $B_{\rho 0}$. Because both quantities are odd symmetric functions around the geometric center of the magnet plus gradient system, they generate a z-directed thrust force according to the Lorentz force equation. Depending on the axial or z-behavior of $B_{\rho 0}$, in particular its value at the location of the conductors of the z-gradient coil, the value of the thrust force can reach several hundred pounds or a few thousand Newtons.

The second problem deals with the interaction between the current density for a transverse x or y-gradient coil and both the $B_{\rho 0}$ and $B_{z0}$ components of the main magnetic field. The result of such an interaction is again determined from the Lorentz force equation, but is a radially directed net force. Due to the azimuthal dependence of the transverse gradient's current density, the radially directed force is along the x or y-direction for an x or y-gradient coil, respectively. Again, the magnitude of this force is dependent on the value of the static magnetic fields $B_{\rho 0}$ and $B_{z0}$ components at the locations of the current lines for the x and y-gradient coils. Because the radius of the x and y-gradient coils is different, the value of the corresponding force will also be different. The value of the components of $B_0$ change with radial position.

Looking first to the analytical evaluation of the z-directed thrust force which is the result of the interaction between the z-gradient coil and the $B_{\rho 0}$ component, a minimization technique is presented for designing z-gradient coils with a zero net thrust force. For a conventional z-gradient coil, the current is odd-symmetric around the geometric center of the coil and the magnetic field $B_{\rho 0}$ is also odd-symmetric around the geometric center of the magnet. Because these two centers normally coincide, the result of the interaction between the current and the $B_{\rho 0}$ field component is a z-directed thrust force on the gradient coil.

With reference to FIGS. 2A and 2B, the z-gradient coil is self-shielded, having an inner or primary winding 60 of radius a and an outer or secondary shield coil 62 of radius b. For simplicity of construction, the primary z-gradient coil is preferably circular loops wound on the dielectric former 34 and potted in epoxy or other resin. The shield z-gradient coil is preferably circularly wound on the dielectric former 38 that is incorporated into the vacuum dewar. Of course, alternate embodiments where it is not an integral part of the vacuum dewar are also possible. The current density for the inner gradient coil $j_\phi^a(z)$ is azimuthally directed and varies only along the axial direction of the coil. Similarly, the current density for the outer gradient coil $J_\phi^b(z)$ is azimuthally directed and also varies along the axial direction of the coil. The interaction between these two current densities with the radial component of the main magnetic field at the radial locations of the coil, i.e., $B_{\rho 0}^a$ and $B_{\rho 0}^b$, respectively generates a Lorentz force which is directed along the z-direction.

In general, the Lorentz equation describes the elemental force experienced by a current element $J_\phi^{a,b}(z)dz(a,b)d\phi\hat{\alpha}_\phi$ in the presence of the magnetic field $B_{\rho 0}^{a,b}$ as:

$$d\vec{F} = J_\phi^a(z)dzad\phi\hat{\alpha}_\phi \times B_{\rho 0}^a\hat{\alpha}_\rho + j_\phi^b(z)dzbd\phi\hat{\alpha}_\phi \times B_{\rho 0}^b\hat{\alpha}_\rho \quad (1).$$

The net force which is generated from these two coils is along the z-direction and has the form:

$$\vec{F}^{net} = F_z^{net}\hat{\alpha}_z$$

with $$F_z^{net} = -2\pi \left\{ a \int_{-\infty}^{+\infty} j_\phi^a(z)B_{\rho 0}^a(z)dz + b \int_{-\infty}^{+\infty} j_\phi^b(z)B_{\rho 0}^b(z)dz \right\}, \quad (2)$$

where $B_{\rho 0}^{a,b}(z)$ are known real functions of (z).
The Fourier transform pairs for $j_\phi^{a,b}$ and $B_{\rho 0}^{a,b}$ are:

$$j_\phi^{a,b}(k) = \int_{-\infty}^{+\infty} j_\phi^{a,b}(z)e^{-ikz}dz, \quad (3a)$$

$$j_\phi^{a,b}(z) = \frac{1}{2\pi} \int_{-\infty}^{+\infty} j_\phi^{a,b}(k)e^{+ikz}dk, \quad (3b)$$

$$B_{\rho 0}^{a,b}(k) = \int_{-\infty}^{+\infty} B_{\rho 0}^{a,b}(z)e^{-ikz}dz, \quad (3c)$$

$$B_{\rho 0}^{a,b}(z) = \frac{1}{2\pi} \int_{-\infty}^{+\infty} B_{\rho 0}^{a,b}(k)e^{+ikz}dk. \quad (3d)$$

These equations can be used to obtain the Fourier or k-space representation of the net thrust force as:

$$F_z^{net} = \left\{ a \int_{-\infty}^{+\infty} j_\phi^a(k)B_{\rho 0}^a(k)dk + b \int_{-\infty}^{+\infty} j_\phi^b(z)B_{\rho 0}^b(k)dk \right\}. \quad (4)$$

Because $B_{\rho 0}^{a,b}(z)$ is a pure real, odd-symmetric function of z:

$$B_{\rho 0}^{*(a,b)}(k) = \int_{-\infty}^{+\infty} B_{\rho 0}^{a,b}(z)e^{+ikz}dz = -B_{\rho 0}^{a,b}(k). \quad (5)$$

For a set of z-gradient coils with radius a,b, respectively, the expression of the axial z-component of the magnetic field due to the gradient coil $B_z$, in the three regions which the two coils define can be simplified, due to the behavior of the current density. More specifically, no angular dependence is considered for a current which is uniform around the circumference of a cylindrical gradient coil. The current in the z-gradient coil is restricted to vary along the z-direction. With these constraints, the expression of $B_z$ in the three regions is:

$$B_z = \frac{\mu_0}{2\pi} \int_{-\infty}^{\infty} dk e^{ikz} k[aj_\phi^a(k)K_1(ka)I_0(k\rho) + bj_\phi^b(k)K_1(kb)I_0(k\rho)], \quad (6a)$$

for $\rho < a$ $$B_z = \frac{\mu_0}{2\pi} \int_{-\infty}^{\infty} dk e^{ikz} k[-aj_\phi^a(k)K_0(k\rho)I_1(ka) + bj_\phi^b(k)K_1(kb)I_0(k\rho)] \quad (6b)$$

for $a < \rho < b$ $$B_z = \frac{\mu_0}{2\pi} \int_{-\infty}^{\infty} dk e^{ikz} k[-aj_\phi^a(k)K_0(k\rho)I_1(ka) - bj_\phi^b(k)K_0(k\rho)I_1(kb)], \quad (6c)$$

for $b < \rho$ where $j_\phi^a(k)$, $j_\phi^b(k)$ are the Fourier transforms of the current densities of the inner coil of radius a and the outer coil of radius b, respectively. Ideally, the z-gradient coil generated magnetic field $B_z$ is linear in the internal region of both coils and zero outside the two coils. In order to satisfy the constraint that the field is zero outside of the two coils, $B_z$ in the region $b<\rho$ is set to zero, i.e., Equation (6c) is set to zero. One way to set Equation (6c) to zero is by relating the current densities of the inner and outer coils such that their Fourier components sum to zero, i.e.:

$$aj_\phi^a(k)K_0(k\rho)I_1(ka) + bj_\phi^b(k)K_0(k\rho)I_1(kb) = 0 \quad (7).$$

or:

$$j_\phi^b(k) = -\frac{aI_1(ka)}{bI_1(kb)} j_\phi^a(k). \quad (8)$$

Substituting Equation (8) into Equation (6a), the expression for the magnetic field for the region inside of the two coils $\rho<a$ becomes:

$$B_z = \frac{\mu_0 a}{2\pi} \int_{-\infty}^{\infty} dk k e^{ikz} j_\phi^a(k) \quad (9)$$

$$I_0(k\rho)K_1(ka)\left(1 - \frac{I_1(ka)K_1(kb)}{I_1(kb)K_1(ka)}\right).$$

From Equation (8), the net force expression can also be simplified:

$$F_z^{net} = a\left\{\int_{-\infty}^{+\infty} j_\phi^a(k)\left(B_{\rho 0}^a(k) - \frac{I_1(ka)}{I_1(kb)}B_{\rho 0}^b(k)\right)\right\}dk. \tag{10}$$

The stored energy in the coil W in terms of Equation (8) is:

$$W = \frac{a^2\mu_0}{2}\int_{-\infty}^{\infty} dk|j_\phi^a(k)|^2 \tag{11}$$

$$I_1(ka)K_1(ka)\left(1 - \frac{I_1(ka)K_1(kb)}{I_1(kb)K_1(ka)}\right).$$

For a gradient coil of length L, the Fourier expansion around the geometric center for the current of the inner coil in a self-shielded design is:

$$j_\phi^a(z) = \sum_{n=1}^{\infty} j_n^a \sin k_n z \text{ for } |z| \leq \frac{L}{2}, \tag{12}$$

$$j_\phi^a(z) = 0 \text{ for } |z| > \frac{L}{2}, \tag{13}$$

where $j_n^a$ are the Fourier coefficients of the expansion and $\sin k_n z$ represents the antisymmetry condition of the current around the origin. For a coil of length L, the current is preferably restricted to become zero at the ends of the coil which restricts the values that $k_n$ can take. Thus, the allowable values for $k_n$ are:

$$j_\phi^a(z) = 0 \text{ for } |z| = \frac{L}{2} \Rightarrow k_n = \frac{2n\pi}{L}. \tag{14}$$

The Fourier transform of $j_\phi^a(z)$ is:

$$j_\phi^a(m,k) = \sum_{n=1}^{\infty} i\frac{L}{2} j_n^a \psi_n(k), \tag{15}$$

with $$\psi_n(k) = \left[\frac{-\sin(k-k_n)\frac{L}{2}}{(k-k_n)\frac{L}{2}} + \frac{\sin(k+k_n)\frac{L}{2}}{(k+k_n)\frac{L}{2}}\right]. \tag{16}$$

Due to the symmetry requirements, the dependence of $\psi_n(k)$ in the variable k is:

$$\psi_n(-k) = -\psi_n(k) \tag{17}.$$

From the expression of the Fourier component of the current, the expressions for the gradient magnetic field $B_z$, the stored magnetic energy W in the gradient coil, and the z-directed thrust force $F_z$ are:

$$B_z = -\frac{\mu_0 a}{2\pi}\int_{-\infty}^{\infty} dk \sin kz\, k \sum_{n=1}^{\infty} \frac{L}{2} j_n^a \psi_n(k) \tag{18}$$

$$I_0(k\rho)K_1(ka)\left(1 - \frac{I_1(ka)K_1(kb)}{I_1(kb)K_1(ka)}\right),$$

$$W_m = \frac{a^2\mu_0}{2}\int_{-\infty}^{\infty} dk I_1(ka)K_1(ka) \tag{19}$$

$$\left(1 - \frac{I_1(ka)K_1(kb)}{I_1(kb)K_1(ka)}\right)\sum_{n=1}^{\infty}\sum_{n'=1}^{\infty} j_n^a j_{n'}^a \frac{L^2}{4}\psi_n(k)\psi_{n'}(k).$$

$$F_z^{net} = a\sum_{n=1}^{\infty} i\frac{L}{2} j_n^a \int_{-\infty}^{\infty} dk\psi_n(k)\left\{B_{\rho 0}^a(k) - \frac{I_1(ka)}{I_1(kb)}B_{\rho 0}^b(k)\right\}. \tag{20}$$

Because $B_{\rho 0}^{a,b}(z)$ is an odd-symmetric function with respect to z, its Fourier transform is defined as:

$$\begin{aligned}B_{\rho 0}^{a,b}(k) &= -i\int_{-\infty}^{\infty} dz(\sin kz)B_{\rho 0}^{a,b}(z) \\ &= -i\tilde{B}_{\rho 0}^{a,b}(k),\end{aligned} \tag{21a}$$

with:

$$\tilde{B}_{\rho 0}^{a,b}(k) = \int_{-\infty}^{\infty} dz(\sin kz)B_{\rho 0}^{a,b}(z). \tag{21b}$$

Equation (20) then has the form:

$$F_z^{net} = a\sum_{n=1}^{\infty}\frac{L}{2} j_n^a \int_{-\infty}^{\infty} dk\psi_n(k)\left\{\tilde{B}_{\rho 0}^a(k) - \frac{I_1(ka)}{I_1(kb)}\tilde{B}_{\rho 0}^b(k)\right\}. \tag{22}$$

From the expressions for the magnetic field, the stored energy, and the z-directed thrust, the functional E can be defined as:

$$E(j_n^a) = W - \sum_{j=1}^{N_1}\lambda_j(B_z(\vec{r}_j) - B_{zSC}(\vec{r}_j)) - \sum_{j=N_1+1}^{N_1+1}\lambda_j(F_z^{net} - F_{zSC}^{net}), \tag{23}$$

where $B_{zSC}$ and $F_{zSC}^{net}$ are the prespecified constraint values of the magnetic field at the constraint points and the z-directed thrust force, respectively.

Minimizing E with respect to $j_n^a$, one obtains a matrix equation for the $j_n^a$ as follows:

$$\sum_{n'=1}^{\infty} j_{n'}^a\left\{\frac{aL\pi}{2}\int_{-\infty}^{\infty} dk I_1(ka)K_1(ka)\left(1 - \frac{I_1(ka)K_1(kb)}{I_1(kb)K_1(ka)}\right)\psi_n(k)\psi_{n'}(k)\right\} = \tag{24a}$$

$$-\sum_{j=1}^{N_1}\lambda_j\int_{-\infty}^{\infty} dk k\sin kz_j I_0(k\rho_j)K_1(ka)\left(1 - \frac{I_1(ka)K_1(kb)}{I_1(kb)K_1(ka)}\right)\psi_n(k)$$

$$-\frac{2\pi}{\mu_0}\sum_{j=N_1+1}^{N_1+1}\lambda_j\int_{-\infty}^{\infty} dk\psi_n(k)\left\{\tilde{B}_{\rho 0}^a(k) - \frac{I_1(ka)}{I_1(kb)}\tilde{B}_{\rho 0}^b(k)\right\},$$

or $$\sum_{n'=1}^{\infty} j_{n'}^a C_{n'n} = \sum_{j=1}^{N_1+1}\lambda_j D_{jn}. \tag{24b}$$

Depending on the value of j, the $D_{jn}$ matrix can correspond to either the magnetic field expression or to the z-directed thrust force expression.

Specifically, the conversion for the $D_{jn}$ matrix is:

$$D_{jn} = \begin{cases} B\text{-field} & \text{for } j = 1, N_1 \\ F_z^{net} & \text{for } j = N_1 + 1, N_1 + 1. \end{cases} \quad (25)$$

For the expression of $B_{\rho 0}^{a,b}(z)$, data is obtained from the actual main magnet 10. Due to the antisymmetry of the $B_{\rho 0}^{a,b}(Z)$, only positive z-values are generated. In order to incorporate the generated data for the radial component of the magnetic field into Equation (24a), consider the following:

$$B_{\rho 0}^{a,b}(z) = \sum_{\gamma=0}^{\Omega} B_\gamma^{a,b}(z_\gamma) \delta(z - z_\gamma), \quad (26)$$

where $\Omega$ corresponds to the total number of points along z, and $B_\gamma^{a,b}$ is the corresponding value of $B_{\rho 0}^{a,b}(z)$ at the location $z_\gamma$. The Fourier transform $\tilde{B}_{\rho 0}^{a,b}(k)$, is:

$$\tilde{B}_{\rho 0}^{a,b}(k) = 2 \sum_{\gamma=0}^{\Omega} B_\gamma^{a,b}(z_\gamma) \sin k z_\gamma \Delta z_\gamma. \quad (27)$$

Furthermore, the generated values for $B_{\rho 0}^{a,b}(z)$ are for the axial distances which are larger than the half length of the gradient coil and up to the point where there is no significant action between the current density of the gradient coils and the main magnet's radial components. Truncating the infinite summations at M terms, the matrix representation for Equation (24b) becomes:

$$J^a C = \lambda D \text{ or } J^a = \lambda D C^{-1} \quad (28)$$

where $J^a$ is a 1×M matrix, C is a M×M matrix, $\lambda$ is a 1×$N_1$+1 matrix, and D is an $N_1$+1×M matrix.

Using the constraint equation for the gradient magnetic field $B_z$ and the z-directed thrust force, the Lagrangian multipliers are determined. The Fourier components of the current density for the primary or inner gradient coil in matrix form are:

$$J^a = B_z [DC^{-1} D^t]^{-1} DC^{-1} \quad (29).$$

Finding the expression for the Fourier components of the current for the inner coil and with the help of Equation (14), the continuous distribution of current density of the inner coil is generated. To determine the current for the outer coil, the shielding relationship between the Fourier transform for both current densities of Equation (8) is used. An inverse Fourier transform is then used to obtain the continuous current distribution for the outer coil.

The next step is the process for discretization of the continuous current distribution for both coils. The continuous current distribution is divided into positive and negative current regions. Integrating the area underneath each region, the total current contained in each region is obtained. When the current for all of the regions of the cylinder is calculated, discrete current loops are positioned on a dielectric former to mimic the behavior of the continuous current pattern. Each region is filled with discrete wires carrying the prescribed amount of current. The amount of current is the same for each wire loop, in the preferred embodiment. In each region, the continuous current density is divided into smaller segments which correspond to the selected equal amount of current. The selected current amount may be iteratively adjusted in order to match the continuous current densities in the selected current regions more closely. Each wire is placed at the midpoint of the corresponding segment in order to obtain an equal distribution from both sides of the segment. This current distribution is then analyzed to calculate the generated magnetic field to assure that the desired magnetic field is, in fact, obtained. Alternately, one can use the center of mass scheme taught in previously referenced U.S. Pat. No. 5,296,810.

With continuing reference to FIG. 2, in the preferred embodiment, the inner or primary coil has a radius of about 340 millimeters and a length of about 700 to 900 millimeters. The outside or shield coil is about 385 millimeters in diameter. For the Fourier series expansion, ten points provide a reasonable definition of the current density, although larger or smaller numbers may be chosen. Five constraint points are preferably chosen to define the characteristics of the field and the thrust force. The field is to be constrained inside a 40 cm. to 50 cm. generally ellipsoidal imaging volume. The first constraint point establishes a gradient field strength, e.g., about 13.5 mT/m. The second constraint point defines the linearity of the field along the gradient axis. Preferably, at the edges of the 25 cm. dimension of the volume, the magnetic field is confined to vary not more than 5%. The remaining two constraints define the uniformity of the field across a plane perpendicular to the gradient axis. Preferably, the magnetic field is constrained to stay within 7% of its actual value at a radial distance of about 22 cm. from the center of the coils.

The last constraint point defines the value of the z-directed thrust force which is preferably less than $-1.0 \, e^{-08}$ Newtons. A suitable primary gradient coil meeting these constraints is illustrated in FIG. 2A and a suitable outer or shield gradient coil meeting these conditions is illustrated in FIG. 3B. It will be noted that the primary gradient coil has several force correcting windings 64 of reversed polarity at its ends or extremes. If these reverse polarity windings were removed, the gradient coil would suffer a net longitudinal force component in excess of the above-discussed constraints.

Although the above-described method calculates an ideal current distribution, the force correcting current for cancelling the axial force can be determined iteratively. More specifically, several coil windings are disposed at the ends of one of the primary and secondary coils, preferably the primary coils. The net force on the gradient coil assembly during a gradient current pulse is measured. The current flow through the force correcting windings (or the number of force correcting loops) is iteratively adjusted until the axial force is substantially zeroed.

Figure 3A:
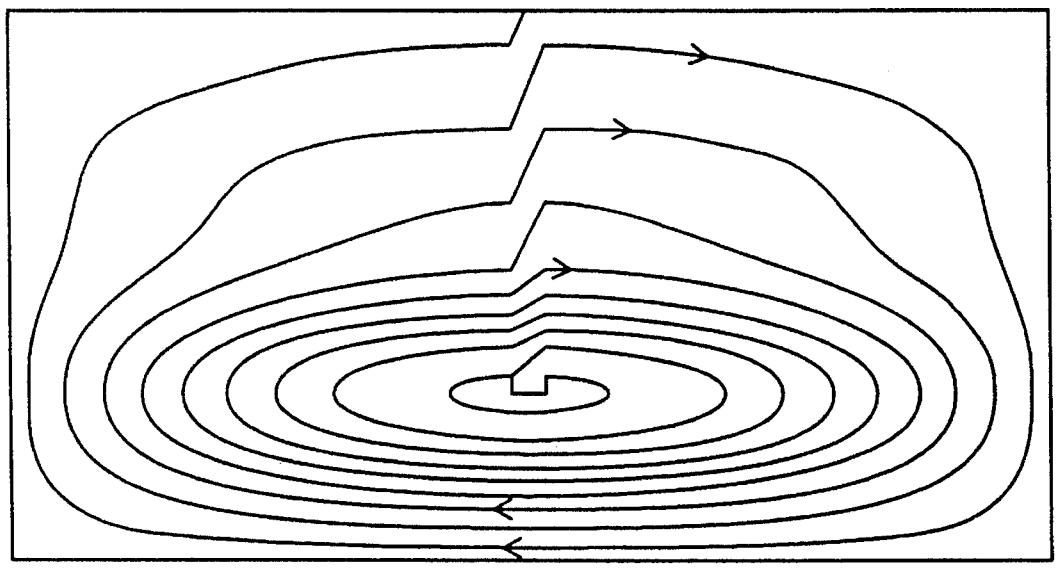
Figure 3B:
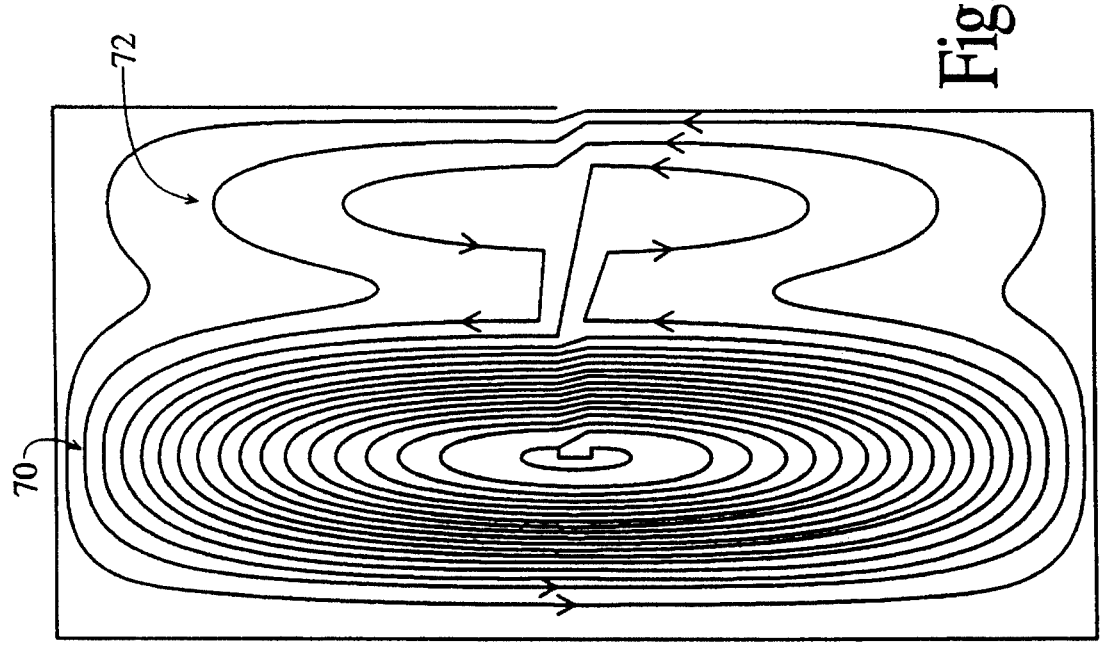

With reference to FIGS. 3A and 3B, the gradient coil assembly further includes an x-gradient coil and a y-gradient coil. The x and y-gradient coils are of substantially the same construction, but rotated 90°. Of course, because one is laminated over the other, they will have a small difference in radius. The x and y-gradient coils each include four substantially identical windings arranged symmetrically on either side of the isocenter. Each of the quadrants of the primary x or y-gradient coil contains a winding substantially as illustrated in FIG. 3A. Each of the quadrants of the shield x or y-gradient coil contains a winding substantially as illustrated in FIG. 3B. A current distribution is again calculated to produce the selected gradient strength, minimize stored energy, and zero the net lateral Lorentz forces.

For the transverse x or y-gradient coils, the total current density can be represented as:

$$\vec{J}^a(\vec{r}) = [j_\phi^a(\phi,z)\hat{\alpha}_\phi + j_z^a(\phi,z)\hat{\alpha}_z]\delta(\rho - \rho_0) \quad (30),$$

where $\delta(\rho - \rho_0)$ is the restriction that the current is confined on a cylindrical surface of radius $\rho_0$. Again, the x and y-gradient coils are self-shielded. That is, they have an inner or primary coil of radius a and an outer secondary or shield coil of radius b. The current density for the outer coil of radius b is analogous to Equation (30). The interaction between the components of the current density and the corresponding components of the main magnetic field yields an x-directed Lorentz force for self-shielded x-gradient coils and a y-direction force for self-shielded y-gradient coils. The following discussion focuses on x-gradient coils. However, it is to be appreciated that the same discussion is equally applicable to y-gradient coils which will be of the same construction but rotated 90° and of slightly different radius.

The Lorentz equation describes the elemental force experienced by a current element $\vec{Idl}$ in the presence of the magnetic field $\vec{B}_0$:

$$d\vec{F} = Id\vec{l} \times \vec{B}_0 \quad (31a),$$

or $$d\vec{F} = (j_\phi^{a,b}(z)\cos(\phi)\hat{\alpha}_\phi + j_z^{a,b}(z)\sin(\phi)\hat{\alpha}_z)dz(a,b)d\phi \times (B_{\rho o}^{a,b}(z)\hat{\alpha}_r + B_{zo}^{a,b}(z)\hat{\alpha}_z) \quad (31b),$$

where $B_{\rho o}^{a,b}(z)$ and $B_{zo}^{a,b}(z)$ are radial and axial components of the main magnetic field $B_0$ at radii locations (a,b). Integrating Equation (31b) results in a net force along the x-axis:

$$\vec{F}^{net} = F_x^{net} \hat{\alpha}_x \quad (32a),$$

with:

$$F_x^{net} = 4\pi a \int_0^{+\infty} \{j_\phi^a(z) B_{z0}^a(z) - j_z^a(z) B_{\rho 0}^a(z)\} dz + 4\pi b \int_0^{+\infty} \{j_\phi^b(z) B_{z0}^b(z) - j_z^b(z) B_{\rho 0}^b(z)\} dz, \quad (32b)$$

where $B_{\rho 0}^{a,b}(z)$ and $B_{z0}^{a,b}(z)$ are known real functions of z. The Fourier transform pairs for $j_\phi^{a,b}$, $j_z^{a,b}$, $B_{\rho 0}^{a,b}$, and $B_{z0}^{a,b}$ are:

$$f_\phi^{a,b}(k) = \int_{-\infty}^{+\infty} f_\phi^{a,b}(z) e^{-ikz} dz, \quad (33a)$$

$$f_\phi^{a,b}(z) = \frac{1}{2\pi} \int_{-\infty}^{+\infty} f_\phi^{a,b}(k) e^{+ikz} dk, \quad (33b)$$

$$f_z^{a,b}(k) = \int_{-\infty}^{+\infty} f_z^{a,b}(z) e^{-ikz} dz, \quad (33c)$$

$$f_z^{a,b}(z) = \frac{1}{2\pi} \int_{-\infty}^{+\infty} f_z^{a,b}(k) e^{+ikz} dk, \quad (33d)$$

$$B_{\rho 0}^{a,b}(k) = \int_{-\infty}^{+\infty} B_{\rho 0}^{a,b}(z) e^{-ikz} dz, \quad (33e)$$

$$B_{\rho 0}^{a,b}(z) = \frac{1}{2\pi} \int_{-\infty}^{+\infty} B_{\rho 0}^{a,b}(k) e^{+ikz} dk, \quad (33f)$$

$$B_{z0}^{a,b}(k) = \int_{-\infty}^{+\infty} B_{z0}^{a,b}(z) e^{-ikz} dz, \quad (33g)$$

$$B_{z0}^{a,b}(z) = \frac{1}{2\pi} \int_{-\infty}^{+\infty} B_{z0}^{a,b}(k) e^{+ikz} dk, \quad (33h)$$

Using the constraint:

$$\vec{\nabla} \cdot \vec{J} = 0$$

and the shielding conditions, the following relationships are derived:

$$j_z^{a,b}(k) = -\frac{1}{k(a,b)} f_\phi^{a,b}(k), \quad (34a)$$

$$j_\phi^b(k) = -\frac{a}{b} \frac{I_1'(ka)}{I_1'(kb)} j_\phi^a(k). \quad (34b)$$

The expression for $F_x^{net}$ from Equation (32b) is rewritten as:

$$F_x^{net} = 2a \int_0^{+\infty} f_\phi^b(k) \left\{ \left[ B_{z0}^{*a}(k) + \frac{1}{ka} B_{\rho 0}^{*a}(k) \right] - \frac{I_1'(ka)}{I_1'(kb)} \left[ B_{z0}^{*b}(k) + \frac{1}{kb} B_{\rho 0}^{*b}(k) \right] \right\}, \quad (35)$$

where * represents the complex conjugate of the Fourier transforms of the two components of the main magnetic field.

For a real magnet design, there is no useful analytic expression for the $B_{z0}^{a,b}(z)$ and $B_{\rho 0}^{a,b}(z)$. In order to incorporate analytically the numerically generated data for both components of the magnetic field along the central z-axis of the magnet, consider the following representations:

$$B_{z0}^{a,b}(k) = 2 \sum_{\gamma=0}^{\Omega} B_{z\gamma}^{a,b}(z_\gamma) \cos k z_\gamma \Delta z_\gamma = B_{z0}^{*(a,b)}(k), \quad (36a)$$

$$B_{\rho 0}^{a,b}(k) = 2 \sum_{\gamma=0}^{\Omega} B_{\rho \gamma}^{a,b}(z_\gamma) \sin k z_\gamma \Delta z_\gamma = -B_{\rho 0}^{*(a,b)}(k), \quad (36b)$$

where $B_{z0}^{a,b}(z)$ is symmetric around z and $B_{\rho 0}^{a,b}(z)$ is antisymmetric around z.

The restriction to the inner coil length, the confinement of the current density to a cylindrical surface, the azimuthal and axial symmetries for the $j_\phi^a$ and $j_z^a$ and the demand that the current density obeys the continuity equation, provides a Fourier series expansion for both components around the geometric center of the coil:

$$j_\phi^a(\phi,z) = \cos\phi \sum_{n=1}^\infty j_{\phi n}^a \cos k_n z \text{ for } |z| \leq \frac{L}{2}, \quad (37a)$$

$$j_z^a(\phi,z) = \sin\phi \sum_{n=1}^\infty \frac{j_{\phi n}^a}{k_n a} \sin k_n z \text{ for } |z| \leq \frac{L}{2}, \quad (37b)$$

where $j_{\phi n}^a$ are the Fourier coefficients, L represents the total length of the inner coil, and $k_n = 2n\pi/L$ because the current cannot flow off of the ends of the cylinder. Furthermore, both current components are zero for $|z| > L/2$.

The general expression for the magnetic field for a self-shielded gradient coil in terms of the Fourier transform of the current density is:

$$B_z = -\frac{\mu_0 a}{2\pi} \sum_{m=-\infty}^\infty e^{+im\phi} \int_{-\infty}^\infty dk k e^{ikz} j_\phi^a(m,k) \quad (38)$$

-continued
$$I_m(k\rho) K'_m(ka) \left(1 - \frac{I'_m(ka) K'_m(kb)}{I'_m(kb) K'_m(ka)}\right),$$

where $j_\phi^a(m,k)$ is the double Fourier transform of $J_\phi^a(\phi,z)$. Since the azimuthal dependence of $j_\phi^a$ is proportional to $\cos(\phi)$, the Fourier transform of $j_\phi^a$ is non-zero when $m=\pm 1$. In this case the two-dimensional Fourier transform of the current density is:

$$j_\phi^a(\pm 1, k) = \frac{1}{2} \sum_{n=1}^{\infty} \frac{L}{2} j_{\phi n}^a \psi_n(k), \tag{39}$$

with:

$$\psi_n(k) = \left[\frac{\sin(k-k_n)\frac{L}{2}}{(k-k_n)\frac{L}{2}} + \frac{\sin(k+k_n)\frac{L}{2}}{(k+k_n)\frac{L}{2}}\right], \tag{40}$$

where $\psi_n(k)$ is an even function of $k$ and $j_\phi^a(+1,k)=j_\phi^a(-1,k)$. Therefore, the expression of the gradient field has the form:

$$B_z = -\frac{\mu_0 aL}{4\pi} \cos\phi \sum_{n=1}^{\infty} j_{\phi n}^a \int_{-\infty}^{\infty} dk \cos kz \psi_n(k) k \tag{41}$$

$$I_1(k\rho) K'_1(ka) \left(1 - \frac{I'_1(ka) K'_1(kb)}{I'_1(kb) K'_1(ka)}\right).$$

In a similar fashion, the stored magnetic energy in the system is:

$$W = -\frac{a^2 \mu_0 L^2}{16} \sum_{n=1}^{\infty} \sum_{n'=1}^{\infty} j_{\phi n}^a j_{\phi n'}^a \int_{-\infty}^{\infty} dk \psi_n(k) \psi_{n'}(k) \tag{42}$$

$$I'_1(ka) K'_1(ka) \left(1 - \frac{I'_1(ka) K'_1(kb)}{I'_1(kb) K'_1(ka)}\right),$$

and the expression for the x-directed Lorentz force is written as:

$$F_x^{net} = aL \sum_{n=1}^{\infty} j_{\phi n}^a \int_0^{+\infty} \psi_n(k) dk \left\{ \left[B_{z0}^{*a}(k) + \frac{1}{ka} B_{\rho 0}^{*a}(k)\right] - \frac{I'_1(ka)}{I'_1(kb)} \left[B_{z0}^{*b}(k) + \frac{1}{kb} B_{\rho 0}^{*b}(k)\right] \right\}. \tag{43}$$

The functional E is constructed and has the identical form of Equation (22). However, in the present case, the dependence of E is over $j_{\phi n}^a$ and the force is directed along the x-axis instead of the z-axis. Thus, minimizing E with respect to $j_{\phi n}^a$ yields a matrix equation for $j_{\phi n'}^a$ as follows:

$$\sum_{n'=1}^{\infty} j_{\phi n'}^a \left\{ \frac{aL\pi}{2} \int_0^\infty dk I'_1(ka) K'_1(ka) \left(1 - \frac{I'_1(ka) K'_1(kb)}{I'_1(kb) K'_1(ka)}\right) \psi_n(k) \psi_{n'}(k) \right\} = \tag{44}$$

$$\sum_{j=1}^{N_1} \lambda_j \cos(\phi_j) \int_0^\infty dk k \cos kz_j I_1(k\rho_j) K'_1(ka) \left(1 - \frac{I'_1(ka) K'_1(kb)}{I'_1(kb) K'_1(ka)}\right) +$$

$$\sum_{j=N_1+1}^{N_1+1} \lambda_j \frac{2\pi}{\mu_0} \int_0^\infty dk \psi_n(k) \left\{ \left[B_{z0}^{*a}(k) + \frac{1}{(ka)} B_{\rho 0}^{*a}(k)\right] - \frac{I'_1(ka)}{I'_1(kb)} \left[B_{z0}^{*b}(k) + \frac{1}{kb} B_{\rho 0}^{*b}(k)\right] \right\}.$$

Truncating the infinite summations at M terms, and using compact notation, Equation (38) simplifies to:

$$\sum_{n'=1}^{M} j_{\phi n'}^a C_{n'n} = \sum_{j=1}^{N_1+1} \lambda_j D_{jn}, \tag{45}$$

or:

$$J^a C = \lambda D \text{ or } J^a = \lambda D C^{-1} \tag{46},$$

where $J^a$ is a 1×M matrix, C is a M×M matrix, $\lambda$ is a 1×$N_1$+1 matrix, and D is a $N_1$+1×M matrix with:

$$D_{jn} = \begin{cases} B\text{-field} & \text{for } j = 1, N_1 \\ F_z^{net} & \text{for } j = N_1+1, N_1+1. \end{cases} \tag{47}$$

Because Equation (46) is the same as Equation (28), the expressions of the continuous current distribution for both coils is found by following the steps described above. To discretize both current densities, one first considers the continuity equation for the current density:

$$\vec{\nabla} \cdot \vec{J} = 0 \tag{48}.$$

In analogy with the magnetic field, where a vector potential is introduced, the current density is expressed as a curl of the stream function $\vec{s}$ as:

$$\vec{J} = \vec{\nabla} \times \vec{S} \tag{49}.$$

Because the current is restricted to flow on the surface of a cylinder of radius $a=\rho_a$ and has only angular and axial dependence, the relation between the current density and the stream function in cylindrical coordinates is:

$$j_\phi^a(\phi,z) \hat{\alpha}_\phi + j_z^a(\phi,z) \hat{\alpha}_z = \frac{\partial S_\rho}{\partial z} \hat{\alpha}_\phi - \frac{1}{a} \frac{\partial S_\rho}{\partial \phi} \hat{\alpha}_z, \tag{50}$$

and $S_\rho$ is found from:

$$S_\rho(\phi,z) = -a \int_{-\pi}^{\phi} d\phi' j_z^a(\phi',z). \tag{51}$$

The contour plots of the current density are determined by:

$$S_\rho(x,z) = \left(n - \frac{1}{2}\right) S_{inc} + S_{min} \text{ for } n = 1, \ldots, N, \tag{52}$$

where N is the number of the current contours, $S_{min}$ is the minimum value of the current density, and $S_{inc}$ represents the amount of the current between two contour lines. The determination of $S_{inc}$ is:

$$S_{inc} = \frac{S_{max} - S_{min}}{N}, \quad (53)$$

with $S_{max}$ representing the maximum value of the current density. The contours which are generated by this method follow the flow of the current and the distance between them corresponds to a current equal to an amount of $S_{inc}$ in amps. The discrete wires are positioned to coincide with these contour lines.

In the preferred embodiment, the self-shielded force free x-gradient coil has a radius of the inner coil of about ⅓ meter and a length which is about 700 to 900 mm. The radius of the outer coil is about 0.4 meters. For the design of this self-shielded coil, the number of Fourier coefficients which are used is equal to the total number of constraint points increased by 1. In addition, four constraint points are chosen to specify the quality of the magnetic field inside a 40–50 cm. by 25 cm. ellipsoidal volume, and to eliminate the net Lorentz force for the whole gradient coil system. The first constraint sets the strength of the gradient field, e.g. 13.5 mT/m. The second constraint specifies the linearity of the gradient field along the x-axis and up to the distance of 25 cm. from the isocenter of the gradient field, e.g., 5%. The third constraint specifies the uniformity of the gradient field along the z-axis at a distance up to ±6 cm. from the isocenter of the gradient field, e.g., 12%. The fourth constraint specifies the value of the net x-directed force on the gradient sets location, e.g., $1 \times 10^{-7}$ Newtons.

The presence of this set of constraints generate a continuous current distribution for both the inner and outer coils which, when discretized, takes the form illustrated in FIGS. 3A and 3B. More specifically, applying these design requirements generates a continuous current distribution of $j_{za}$ and $j_{zb}$. Only the z-component of the current density is necessary for the creation of a discrete current pattern. The constraints are also chosen such that an integer number of turns for the inner and outer coils with a constant amount of current per loop can be obtained. Using the stream function technique, the discrete current distribution of the inner coil for the lateral force free configuration is obtained as illustrated in FIG. 3A. It will be noted that the inner or primary coil has a thumbprint winding 70 and an additional or force offsetting winding 72. The current in the force correcting winding effectively flows in an opposite spiral direction to the primary coil portion 70. The current distribution and number of turns in the force cancelling coil portion 72 is selected to zero the net x or y-direction force generated by the primary coil section 70 of FIG. 3A. Depending on the nature of the $B_0$ field components in a particular design, similar force free results can also be obtained by placing a winding having an opposite sense than the secondary x or y-gradient coil near an outer edge of that coil. The amperage through the force offsetting windings or the number of windings are adjusted until a current density is achieved which produces an x or y-force component which is equal and opposite to the force component generated by the other x or y-gradient coils.

Although force balancing coils are applied to only the primary winding of shielded gradient coils in the preferred embodiment, it is to be appreciated that the primary and secondary coils can each be individually force balanced. Further, it is to be appreciated that the thrust force balancing is also applicable to gradient coils which are not self-shielded, i.e., which have only a primary winding and no secondary shield winding.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In a magnetic resonance imaging apparatus which includes a main magnet for generating a temporally constant magnetic field through a patient receiving bore and gradient field and RF coils around the bore and in which the temporally constant magnetic field has radial magnetic field components which interact with current pulses applied to principal windings of the gradient field coil to generate magnetic field gradients in such a manner that a net thrust force is experienced by the gradient field coil, THE IMPROVEMENT COMPRISING:

additional windings mounted adjacent opposite edge areas of the gradient field coil which carry currents in an opposite sense to the principal windings such that the net thrust force is substantially cancelled.

2. A magnetic resonance imaging apparatus comprising:

a bore for receiving a subject to be imaged, the bore having a diameter and an axial length;

an annular magnet surrounding the bore to generate a temporally constant magnetic field axially through the bore, the temporally constant magnetic field having non-uniformities and radial components adjacent the bore;

a radio frequency coil disposed around the bore and positioned to broadcast radio frequency signals into the bore and receive radio frequency signals from the bore;

a symmetric gradient coil assembly disposed around the bore, the gradient coil assembly having a length less than the length of the bore and having an isocenter, the gradient coil assembly having gradient windings which carry current pulses to generate corresponding magnetic field gradients across the bore, the gradient windings being mirror image symmetric about the isocenter, the current pulses interacting with the temporally constant magnetic field non-uniformities and radial components to exert a net thrust force on the gradient coil assembly, thrust force correction windings disposed symmetrically adjacent opposite ends of the gradient coil assembly for carrying current pulses to generate an offsetting thrust force which offsets the thrust forces generated by interaction of the current pulses for generating the magnetic field gradients and the temporally constant magnetic field.

3. A magnetic resonance imaging apparatus comprising:

a bore for receiving a subject to be imaged, the bore having a diameter and an axial length;

an annular magnet surrounding the bore to generate a temporally constant magnetic field axially through the bore, the temporally constant magnetic field having non-uniformities and radial components adjacent the bore;

a radio frequency coil disposed around the bore and positioned to broadcast radio frequency signals into the bore and receive radio frequency signals from the bore;

a gradient coil assembly disposed around the bore, the gradient coil assembly having a length less than the length of the bore, the gradient coil assembly having gradient windings which carry current pulses to generate corresponding magnetic field gradients across the bore, the current pulses interacting with the temporally constant magnetic field non-uniformities and radial components to exert a net force on the gradient coil assembly, force correction windings disposed adjacent ends of the gradient coil assembly for carrying current pulses to generate an offsetting force which offsets the forces generated by interaction of the current pulses for generating the magnetic field gradients and the temporally constant magnetic field, the gradient coil assembly including a z-gradient coil including:

a cylindrical former;

a first plurality of loops extending around the former on a first side of the isocenter of the temporally constant magnetic field, the first plurality of loops carrying current pulses primarily in a first direction circumferentially around the former;

a second plurality of loops extending around the former on a second side of the isocenter, the second plurality of loops being mirror image symmetric about the isocenter with the first plurality of loops, the second plurality of loops carrying the current pulses primarily in a second direction circumferentially around the former, the second direction being opposite to the first direction, the current pulses passing through the first and second plurality of loops interacting with the radial components of the temporally constant magnetic field to cause a net axial force;

first force offset coils extending around the former on the first side of isocenter displaced from the isocenter, the first force offset coils carrying the current pulses in the second direction;

second force offset coils extending around the former on the second side of isocenter and displaced from the isocenter, the second force offset coils carrying the current pulses in a first direction, the current pulses passing through the first and second force offset coils interacting with the radial components of the temporally constant magnetic field to cause an axial force which offsets the net axial force.

4. A magnetic resonance imaging apparatus comprising:

a bore for receiving a subject to be imaged, the bore having a diameter and an axial length;

an annular magnet surrounding the bore to generate a temporally constant magnetic field axially through the bore, the temporally constant magnetic field having non-uniformities and radial components adjacent the bore;

a radio frequency coil disposed around the bore and positioned to broadcast radio frequency signals into the bore and receive radio frequency signals from the bore;

a gradient coil assembly disposed around the bore, the gradient coil assembly having a length less than the length of the bore, the gradient coil assembly including a primary z-gradient coil including:

a series of loop coils mounted around a cylindrical former for generating a z-gradient field axially along the bore, current pulses in the series of z-gradient loop coils interacting with the temporally constant magnetic field non-uniformities and radial components to exert a net axial thrust force on the gradient coil assembly, axial thrust force correction windings including loops extending around ends of the cylindrical former and being connected in series with the z-gradient loop coils for carrying the current pulses but in an opposite direction for generating an offsetting axial thrust force which offsets the axial thrust force generated by interaction of the z-gradient loop coil current pulses such that a net axial thrust on the gradient coil assembly is minimized.

5. The magnetic resonance imaging apparatus as set forth in claim 4 further including a shield z-gradient coil mounted surrounding and radially outward from the primary z-gradient coil, current pulses applied to the primary and shield z-gradient coils causing magnetic fields which combine to produce a magnetic field gradient along a z-axis within the gradient coil assembly and which generally cancel outside of the z-gradient coil assembly.

6. The magnetic resonance imaging apparatus as set forth in claim 2 wherein the gradient coil assembly includes a primary z-gradient coil and a secondary, shield z-gradient coil, the secondary z-gradient coil being disposed surrounding the primary z-gradient coil, current pulses applied to the primary and secondary z-gradient coils causing magnetic fields which combine within the gradient coil assembly to generate a linear gradient axially along the coil and which generally cancel exterior to the z-gradient coil.

7. The magnetic resonance imaging apparatus as set forth in claim 6 wherein the primary and secondary gradient coils include annular loops and wherein the force correction windings includes loops disposed on the ends of at least one of the primary and secondary coils.

8. A magnetic resonance imaging apparatus comprising:

a bore for receiving a subject to be imaged, the bore having a diameter and an axial length;

an annular magnet surrounding the bore to generate a temporally constant magnetic field axially through the bore, the temporally constant magnetic field having non-uniformities and radial components adjacent the bore;

a radio frequency coil disposed around the bore and positioned to broadcast radio frequency signals into the bore and receive radio frequency signals from the bore;

a gradient coil assembly disposed around the bore, the gradient coil assembly having a length less than the length of the bore, the gradient coil assembly having gradient windings which carry current pulses to generate corresponding magnetic field gradients across the bore, the current pulses interacting with the temporally constant magnetic field non-uniformities and radial components to exert a net force on the gradient coil assembly, force correction windings disposed adjacent ends of the gradient coil assembly for carrying current pulses to generate an offsetting force which offsets the forces generated by interaction of the current pulses for generating the magnetic field gradients and the temporally constant magnetic field, the gradient coil assembly includes primary and secondary gradient coils which each include four symmetrically arranged thumbprint coils for generating a magnetic field gradient transverse to a longitudinal axis of the bore, the thumbprint coils further generating a net transverse force, at least one of the primary and secondary gradient coils further including force offsetting current loops disposed adjacent an end thereof for carrying current flows which circulate in an opposite direction to a most adjacent thumbprint coil for offsetting the net transverse force along the transverse direction.

9. The magnetic resonance imaging system as set forth in claim 2 wherein the bore has a length to diameter ratio of substantially 1:1.

10. The magnetic resonance imaging apparatus as set forth in claim 2 wherein the bore has a length to diameter ratio of less than 1.5:1.

11. The magnetic resonance imaging apparatus as set forth in claim 2 wherein the gradient coil assembly is a self-shielded gradient coil having a primary coil and a shield coil, current pulses passing through the primary and shield coils generating magnetic fields that combine within the gradient coil assembly to form a linear magnetic field gradient and tending to cancel outside the gradient coil assembly, the current pulses that pass through the shield coil interact with the radial magnetic field components to generate a first force, the primary gradient coil being wound such that the current pulses passing through the primary gradient coil interact with the radial magnetic field components to generate a second force that is substantially equal and opposite to the first force.

12. A method of designing gradient coils for a magnetic resonance imaging system in which a main field magnet generates a temporally constant magnetic field along a primary field axis, the temporally constant magnetic field having a primary field component along the primary field axis and secondary components transverse to the primary field axis, the gradient coils having coil winding patterns for generating magnetic field gradient components along orthogonal x, y, and z-axes, one of the x, y, and z-axes being parallel to the primary field axis, each of the coil winding patterns being configured to generate corresponding magnetic field gradient components having a preselected gradient field strength, at least a preselected gradient field linearity, at least a preselected gradient field uniformity, electrical currents applied to the gradient coil winding patterns interacting with the secondary, transverse magnetic field components to urge the gradient coil assembly along the x, y, and z-axes, the method comprising:

constraining the coil winding patterns such that the current pulses flowing through the gradient coil winding patterns interact with transverse components of a main magnetic field within which the gradient coil is disposed to cause offsetting thrust forces along at least one of the x, y, and z-axes such that the net thrust force on the gradient coil assembly is substantially cancelled.

* * * * *